(12) United States Patent
Fukuda

(10) Patent No.: US 12,256,577 B2
(45) Date of Patent: Mar. 18, 2025

(54) SOLAR CELL

(71) Applicant: KANEKA CORPORATION, Osaka (JP)

(72) Inventor: Masanori Fukuda, Toyooka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 18/247,214

(22) PCT Filed: Oct. 5, 2021

(86) PCT No.: PCT/JP2021/036780
§ 371 (c)(1),
(2) Date: Mar. 29, 2023

(87) PCT Pub. No.: WO2022/075308
PCT Pub. Date: Apr. 14, 2022

(65) Prior Publication Data
US 2023/0378381 A1 Nov. 23, 2023

(30) Foreign Application Priority Data
Oct. 5, 2020 (JP) .................................. 2020-168592

(51) Int. Cl.
*H10F 77/20* (2025.01)
(52) U.S. Cl.
CPC .................................. *H10F 77/219* (2025.01)
(58) Field of Classification Search
CPC ................. H01L 31/044; H01L 31/042; H01L 31/022433
See application file for complete search history.

(56) References Cited

U.S. PATENT DOCUMENTS 4,228,315 A * 10/1980 Napoli ............ H01L 31/022433
257/448
8,569,096 B1 10/2013 Babayan et al.
(Continued)

FOREIGN PATENT DOCUMENTS

CN 104851927 A * 8/2015
CN 106384750 A 2/2017
(Continued)

OTHER PUBLICATIONS

Machine translation of KR20180072110A (Year: 2018).*
(Continued)

*Primary Examiner* — Ryan S Cannon
(74) *Attorney, Agent, or Firm* — Studebaker Brackett PLLC

(57) ABSTRACT

Provided is a solar cell including: a semiconductor substrate having a substantially rectangular shape; and collector electrodes. The semiconductor substrate is sectioned into first, second, third, and fourth large sections by a first large sectioning line passing a center of a first side of the semiconductor substrate and substantially parallel to a second side of the semiconductor substrate and a second large sectioning line passing through a center of the second side of the semiconductor substrate and substantially parallel to the first side of the semiconductor substrate. The collector electrodes include finger electrodes. The finger electrodes provided on each of the first and third large sections extends in a first direction, and the finger electrodes provided on each of the second and the fourth large sections extends in a second direction.

9 Claims, 20 Drawing Sheets

(56) References Cited

U.S. PATENT DOCUMENTS

| | | | |
|---|---|---|---|
| 2008/0230115 A1 | 9/2008 | Kannou et al. | |
| 2011/0079270 A1* | 4/2011 | Tibbits | H01L 31/022425 |
| | | | 136/246 |
| 2012/0273022 A1* | 11/2012 | Van Roosmalen | |
| | | | H01L 31/0516 |
| | | | 136/244 |
| 2016/0013344 A1 | 1/2016 | Flynn et al. | |
| 2017/0186885 A1 | 6/2017 | Harley | |
| 2018/0114873 A1 | 4/2018 | Koizumi et al. | |

FOREIGN PATENT DOCUMENTS

| | | | | |
|---|---|---|---|---|
| CN | 209418517 U | 9/2019 | | |
| CN | 210006747 U | 1/2020 | | |
| EP | 3666524 A1 * | 6/2020 | | B41F 15/08 |
| JP | 2008-235521 A | 10/2008 | | |
| JP | 2011-134765 A | 7/2011 | | |
| JP | 2016-512394 A | 4/2016 | | |
| JP | 2017-517145 A | 6/2017 | | |
| JP | 6467549 B1 | 2/2019 | | |
| KR | 20110033325 A * | 3/2011 | | |
| KR | 20180072110 A * | 6/2018 | | |
| WO | 2015/183827 A2 | 12/2015 | | |
| WO | 2016/158299 A1 | 10/2016 | | |
| WO | 2017/116716 A1 | 7/2017 | | |

OTHER PUBLICATIONS

Machine translation of CN104851927A (Year: 2015).*
Machine translation of KR20110033325A (Year: 2011).*
Machine translation of EP3666524A1 (Year: 2020).*
International Search Report issued in PCT/JP2021/036780; mailed Nov. 22, 2021.
Notification of Transmittal of Translation of the International Preliminary Report on Patentability and Translation of Written Opinion of the International Searching Authority; PCT/JP2021/036780; mailed on Apr. 20, 2023.

* cited by examiner

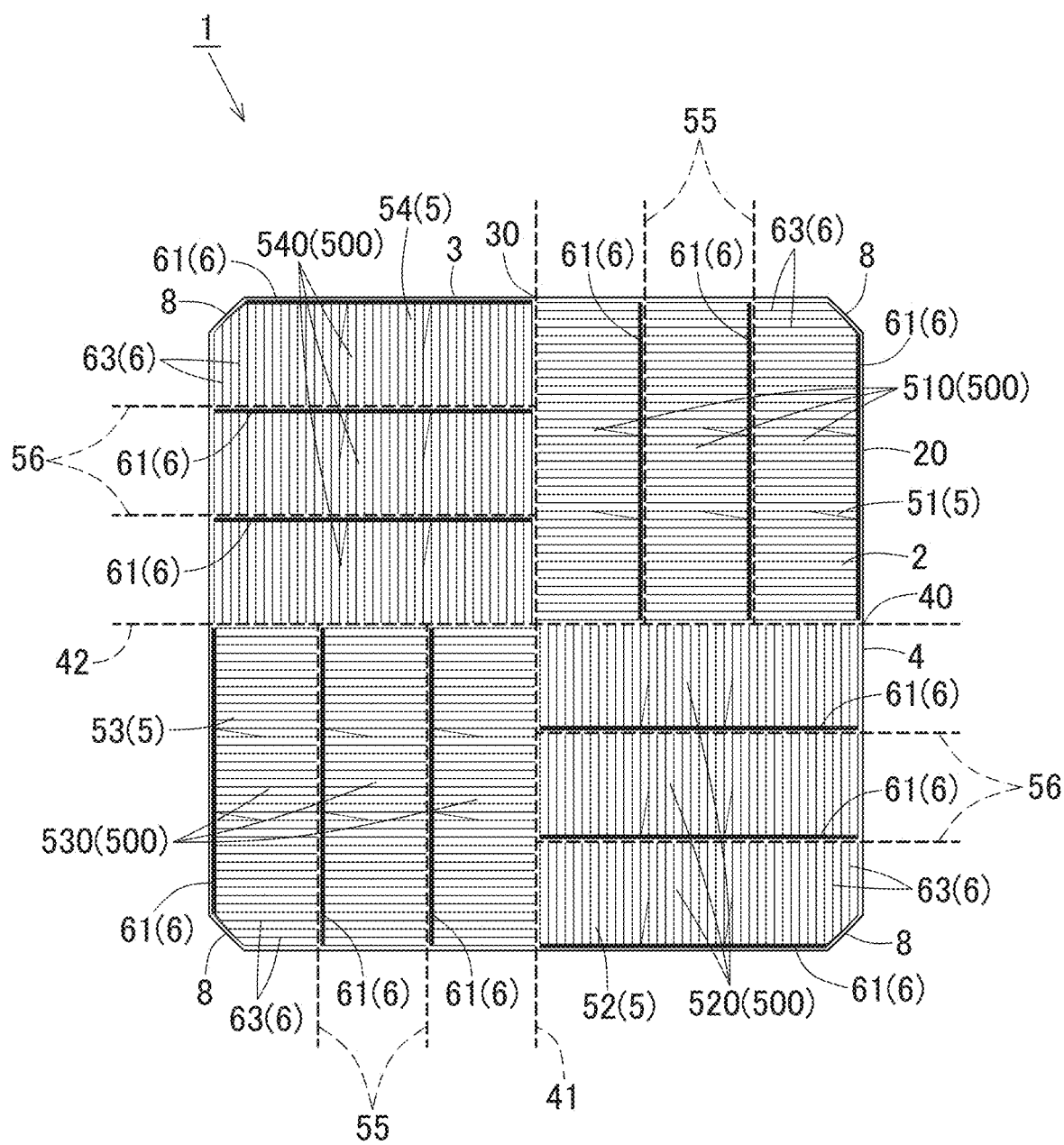

SOLAR CELL

CROSS-REFERENCE TO RELATED APPLICATION

This application claims priority to Japanese Patent Application No. 2020-168592, the disclosure of which is incorporated herein by reference in its entirety.

FIELD

The present invention relates to a solar cell, and in particular, to a solar cell suitable for being used for interconnection by shingling.

BACKGROUND

Conventionally, solar cells having various structures have been proposed. One of these solar cells is divided into a plurality of small element pieces each having a strip shape (Patent Literature 1). The plurality of small element pieces can form a solar cell module by being interconnected with each other by shingling, in which these small element pieces are sequentially arranged in such a manner that the small element pieces have their long sides overlapping each other, for example so as to shingle roof boards.

The solar cell has, for example, an octagonal shape formed as if a square has chamfered portions provided at its respective four corners. The solar cell includes a semiconductor substrate formed of, for example, a thin slice in a transverse direction of a silicon single-crystal ingot having a columnar shape, and a collector electrode formed on the semiconductor substrate. The solar cell is divided along a straight line substantially parallel to one side thereof to thereby obtain the plurality of small element pieces.

CITATION LIST

Patent Literature

Patent Literature 1: JP 6467549 B

SUMMARY

Technical Problem

In the above structure, the dimension of a long side of each of the plurality of small element pieces is equal to the dimension of the one side of the solar cell before being divided into the plurality of small element pieces. The dimension of the one side of the solar cell before the division is equal to the dimension of one side of the abovementioned semiconductor substrate formed of a thin slice in the transverse direction of the silicon single crystal ingot. Since the semiconductor substrate when being formed attempts to utilize the largest possible area of the cross-section in the transverse direction of the silicon single crystal ingot, the dimension of the one side of the semiconductor substrate corresponds to the size of the cross-section of the silicon single crystal ingot. This configuration restricts the size and shape of the solar cell module formed by interconnecting the plurality of small element pieces with each other by shingling.

It is therefore an object of the present invention to provide a solar cell for forming small element pieces to be interconnected with each other by shingling, the solar cell capable of being used for solar cell modules of various sizes and shapes.

Solution to Problem

A solar cell of the present invention is a solar cell having a substantially rectangular shape, the solar cell including: a semiconductor substrate having a substantially rectangular shape; and a plurality of collector electrodes formed on the semiconductor substrate, in which the semiconductor substrate is sectioned into four large sections by a first large sectioning line that is a straight line passing a center of a first side of the semiconductor substrate and substantially parallel to a second side continuous with the first side of the semiconductor substrate, and by a second large sectioning line that is a straight line passing through a center of the second side of the semiconductor substrate and substantially parallel to the first side of the semiconductor substrate, the four large sections include a first large section, a second large section, a third large section, and a fourth large section, which are aligned next to each other in a clockwise order, the plurality of collector electrodes include a plurality of finger electrodes, in which each of the first large section, the second large section, the third large section, and the fourth large section is provided on a front side with at least one of the plurality of finger electrodes, the at least one of the plurality of finger electrodes provided on each of the first large section and the third large section extends in a first direction substantially parallel to the first side of the semiconductor substrate, and the at least one of the plurality of finger electrodes provided on each of the second large section and the fourth large section extends in a second direction substantially parallel to the second side of the semiconductor substrate.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, the at least one of the plurality of bus bar electrodes provided on each of the first large section and the third large section extends in the second direction, and the at least one of the plurality of bus bar electrodes provided on each of the second large section and the fourth large section extends in the first direction.

The solar cell can be configured such that each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of small sections has at least one of the plurality of bus bar electrodes provided on the front side.

The solar cell can be configured such that each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of collector electrodes is provided at a position not coinciding with the first small sectioning line and the second small sectioning line.

The solar cell can be configured such that each of the plurality of small sections has a substantially rectangular shape, and a bus bar electrode provided in each of the plurality of small sections having one of a pair of long sides formed by an end edge of the semiconductor substrate is disposed at a position opposite to the end edge of the semiconductor substrate.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, each of the plurality of collector electrodes is provided at a position not coinciding with the first small sectioning line and the second small sectioning line, each of the plurality of small sections has a substantially rectangular shape, and the at least one of the plurality of bus bar electrodes provided in each of the plurality of small sections having one of a pair of long sides formed by an end edge of the semiconductor substrate is disposed at a position opposite to the end edge of the semiconductor substrate.

The solar cell can be configured such that each of the plurality of bus bar electrodes is formed of a plurality of dot electrodes that are respectively provided at one ends of the plurality of finger electrodes and arranged at intervals from each other.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, and each of the plurality of bus bar electrodes is formed of a plurality of dot electrodes that are respectively provided at one ends of the plurality of finger electrodes and arranged at intervals from each other.

The solar cell can be configured such that the plurality of collector electrodes include the plurality of finger electrodes only, and include no bus bar electrode.

BRIEF DESCRIPTION OF DRAWINGS

FIG. 1A is a front view of a solar cell according to this embodiment.

DESCRIPTION OF EMBODIMENTS

Figure 1B:
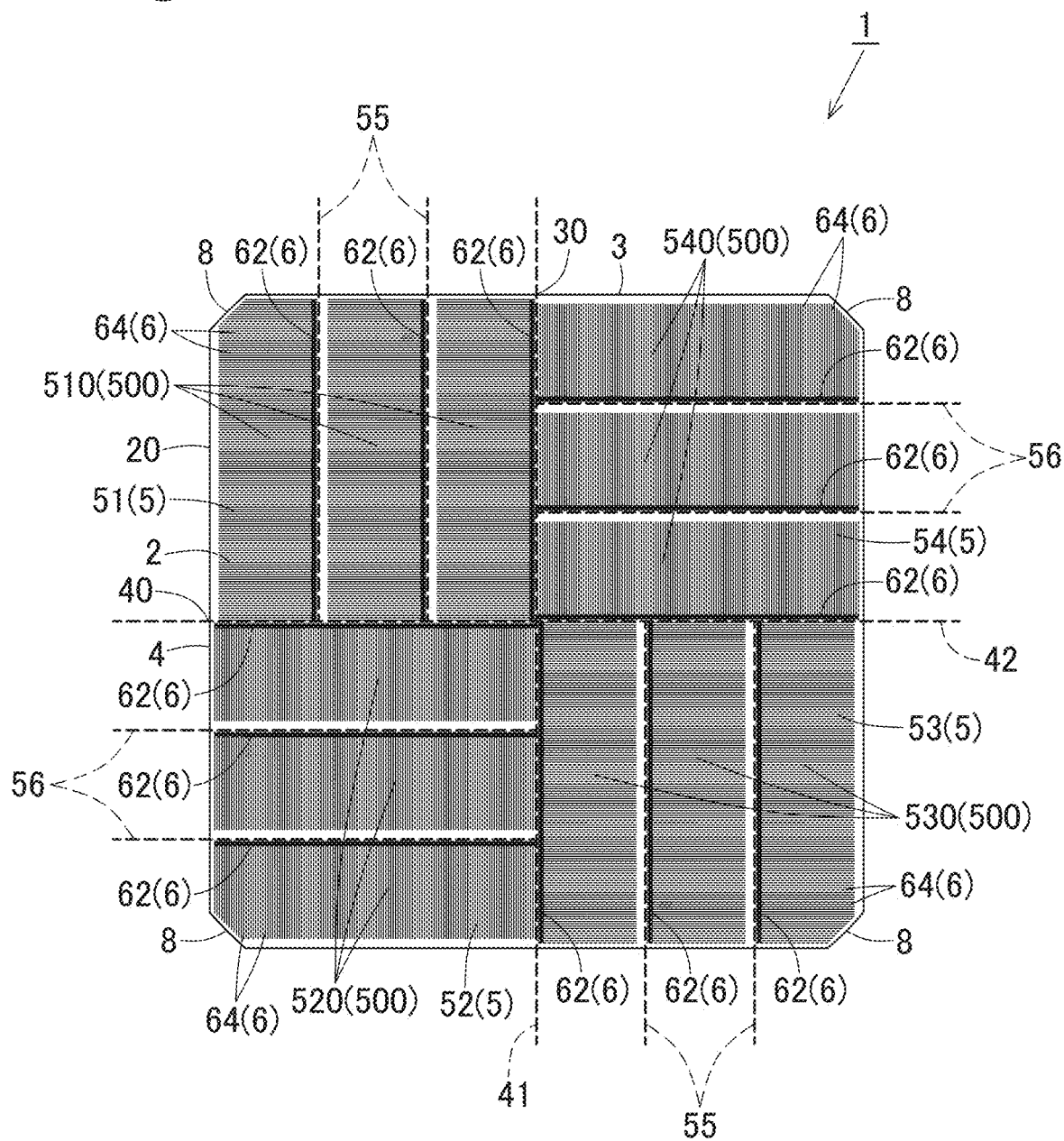
FIG. 1B is a rear view of the solar cell.
Figure 1C:
FIG. 1C is a plan view of the solar cell.
Figure 1D:
FIG. 1D is a bottom view of the solar cell.
Figure 1E:
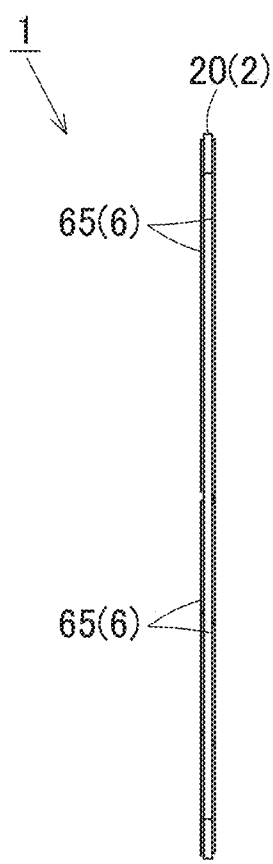
FIG. 1E is a right side view of the solar cell.
Figure 1F:
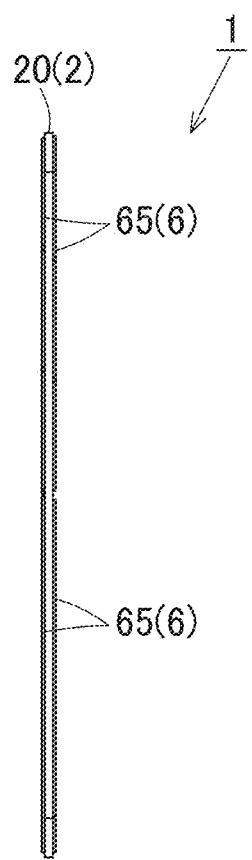
FIG. 1F is a left side view of the solar cell.

One embodiment of the present invention will be hereinafter described with reference to the drawings. The term "front surface" herein refers to a surface appearing in FIG. 1A, and the term "rear surface" herein refers to a surface appearing in FIG. 1B.

As shown in FIG. 1A to FIG. 1F, the solar cell 1 of this embodiment has a substantially rectangular shape, and includes a semiconductor substrate 2 having a substantially rectangular shape and a plurality of collector electrodes 6 formed on the semiconductor substrate 2. The solar cell 1 of this embodiment will be hereinafter described as a "semi-finished product" or "product in progress" on the premise that it is divided into a plurality of small element pieces 7 for interconnection with each other by shingling to form a solar cell module 10. The solar cell 1 of this embodiment on its own can be handled as a final product. The basic configuration of how the solar cell 1 generates and collects power shall be the same as any known configuration.

The semiconductor substrate 2 is formed of, for example, a thin slice in a transverse direction of a silicon single crystal ingot having a columnar shape. Since the silicon single crystal ingot has a circular shape in cross section in the transverse direction, the semiconductor substrate 2 is made to have an octagonal shape composed of a square with chamfered portions 8 provided at its respective four corners when an attempt is made to utilize the largest possible area in the cross-section in the transverse direction (see FIG. 1A). Herein, the definition of the "substantially rectangular shape" includes the shape as described above. The shape of the semiconductor substrate 2 is not limited to this, and can be, for example, a square shape or a rectangular shape. Further, the shape of each of the chamfered portions 8 is not limited to a linear shape, and can be a curved shape. The semiconductor substrate 2 of this embodiment is made of silicon without limitation thereto, and can be made of various semiconductor materials.

The plurality of collector electrodes 6 include a plurality of finger electrodes 63, 64. The collector electrodes of this embodiment include a plurality of bus bar electrodes 61, 62. Each of the plurality of bus bar electrodes 61, 62 has the plurality of finger electrodes 63, 64 connected thereto so as to cross the bus bar electrode 61, 62. These collector electrodes 6 can efficiently collect and take out electricity generated in the solar cell 1.

Each of the bus bar electrodes 61, 62 of this embodiment has a linear shape. Each of the finger electrodes 63, 64 of this embodiment has a linear shape.

The semiconductor substrate 2 is sectioned into four large sections 5 by a first large sectioning line 41 that is a straight line passing a center 30 of a first side 3 of the semiconductor substrate 2 and substantially parallel to a second side 4 continuous with the first side 3 of the semiconductor substrate 2 through the chamfered portion 8, and by a second large sectioning line 42 that is a straight line passing through a center 40 of the second side 4 of the semiconductor substrate 2 and substantially parallel to the first side 3 of the semiconductor substrate 2. When the semiconductor substrate 2 has a square or rectangular shape, the first side 3 of the semiconductor substrate 2 is continuous with the second side 4 with no chamfered portion 8 therebetween.

The four large sections 5 include a first large section 51, a second large section 52, a third large section 53, and a fourth large section 54, which are aligned next to each other in a clockwise order. In the semiconductor substrate 2 of this embodiment, the four large sections 5 share the same shape and size.

The plurality of collector electrodes 6 include the plurality of finger electrodes 63, and each of the first large section 51, the second large section 52, the third large section 53, and the fourth large section 54 is provided on a front side with at least one of the plurality of finger electrodes 63. The at least one finger electrode 63 provided on each of the first large section 51 and the third large section 53 extends in a first direction substantially parallel to the first side 3 of the semiconductor substrate 2 (i.e., a horizontal direction in FIG. 1A; hereinafter referred to also simply as "horizontal direction"). The at least one finger electrode 63 provided on each of the second large section 52 and the fourth large section 54 extends in a second direction substantially parallel to the second side 4 of the semiconductor substrate 2 (i.e., a vertical direction in FIG. 1A; hereinafter referred to also simply as "vertical direction").

In the semiconductor substrate 2 of this embodiment, the plurality of collector electrodes 6 include the plurality of bus bar electrodes 61, and each of the first large section 51, the second large section 52, the third large section 53, and the fourth large section 54 is provided on the front side with at least one of the plurality of bus bar electrodes 61. The at least one bus bar electrode 61 provided on each of the first large section 51 and the third large section 53 extends in the second direction (vertical direction). The at least one bus bar electrode 61 provided on each of the second large section 52 and the fourth large section 54 extends in the first direction (horizontal direction).

The plurality of collector electrodes 6 include a plurality of finger electrodes 64, and each of the first large section 51, the second large section 52, the third large section 53, and the fourth large section 54 is provided on a rear side with at least one of the plurality of finger electrodes 64. The at least one finger electrode 64 provided on each of the first large section 51 and the third large section 53 extends in the first direction (horizontal direction) (see FIG. 1B). The at least one finger electrode 64 provided on each of the second large section 52 and the fourth large section 54 extends in the second direction (vertical direction).

In the semiconductor substrate 2 of this embodiment, the plurality of collector electrodes 6 include the plurality of bus bar electrodes 62, and each of the first large section 51, the second large section 52, the third large section 53, and the fourth large section 54 is provided on the rear side with at least one of the plurality of bus bar electrodes 62. The at least one bus bar electrode 62 provided on each of the first large section 51 and the third large section 53 extends in the second direction (vertical direction). The at least one bus bar electrode 62 provided on each of the second large section 52 and the fourth large section 54 extends in the first direction (horizontal direction).

In the semiconductor substrate 2 of this embodiment, the number, shape, and arrangement of the finger electrodes 63 provided on the front side of one of the four large sections 5 are the same as those of the finger electrodes 63 provided on another one of the four large sections 5. The number, shape, and arrangement of the bus bar electrodes 61 provided on one of the four large sections 5 are the same as those of the bus bar electrodes provided on another one of the four large sections 5. The same applies to the finger electrodes 64 and the bus bar electrodes 62 provided on the back side of the four large sections 5. The number, shape, and arrangement of the finger electrodes 63 and the bus bar electrodes 61 provided on the front side of one of the four large sections 5 can be different from those of the finger electrodes 63 and the bus bar electrodes 61 provided on another one of the four large sections 5. The number, shape, and arrangement of the finger electrodes 64 and the bus bar electrodes 62 provided on the back side of one of the four large sections 5 can be different from those of the finger electrodes 64 and the bus bar electrodes 62 provided on another one of the four large sections 5.

Each of the first large section 51 and the third large section 53 is sectioned into a plurality of small sections 500 by a first small sectioning line 55 that is at least one straight line extending in the second direction (vertical direction) (see FIG. 1A). Each of the second large section 52 and the fourth large section 54 is sectioned into the plurality of small sections 500 by a second small sectioning line 56 that is at least one straight line extending in the first direction (horizontal direction).

In the semiconductor substrate 2 of this embodiment, each of the bus bar electrodes 61, 62 is provided on each of the small sections 500.

The first large section 51 and the third large section 53 share the same number of the first small sectioning lines 55 provided thereon, but can have different numbers of the first small sectioning lines 55 provided thereon. The second large section 52 and the fourth large section 54 share the same number of the second small sectioning lines 56 provided thereon, but can have different numbers of the second small sectioning lines 56 provided thereon. In the semiconductor substrate 2 of this embodiment, the number of the first small sectioning lines 55 provided on each of the first large section 51 and the third large section 53 is the same as the number of the second small sectioning lines 56 provided on each of the second large section 52 and the fourth large section 54.

In the semiconductor substrate 2 of this embodiment, a plurality of the first small sectioning lines 55 or a plurality of the second small sectioning lines 56 are provided on each of the large sections 5. In each of the large sections 5 in this embodiment, the plurality of first small sectioning lines 55 or the plurality of second small sectioning lines 56 are arranged at an equal interval(s) from each other.

Specifically, in this embodiment, each of the large sections 5 is sectioned into three small sections 500 by two first small sectioning lines 55 or two second small sectioning lines 56. More specifically, the first large section 51 is sectioned into three first small sections 510 by two first small sectioning lines 55 each extending in the vertical direction. The third large section 53 is sectioned into three third small sections 530 by two first small sectioning lines 55 each extending in the vertical direction. The second large section 52 is sectioned into three second small sections 520 by two second small sectioning lines 56 each extending in the horizontal direction. The fourth large section 54 is sectioned into three fourth small sections 540 by two second small sectioning lines 56 each extending in the horizontal direction.

The semiconductor substrate 2 as described above is sectioned into 12 small sections 500 by the first large sectioning line 41, the second large sectioning line 42, the first small sectioning lines 55, and the second small sectioning lines 56. Further, in the semiconductor substrate 2 of this embodiment, each of the large sections 5 has three bus bar electrodes 61 provided thereon.

Each of the small sections 500 has, for example, a substantially rectangular shape. Out of the small sections 500, the small section 500 that includes both at least a part of the first side 3 and at least a part of the second side 4, that is, the small section 500 having one of the chamfered portions 8 in the solar cell 1 of this embodiment has one bus bar electrode 61 provided on its front side along an end edge 20 of the semiconductor substrate 2. Out of the small sections 500, the small section 500 that includes only a part of the first side 3 or the small section 500 that includes only a part of the second side 4, that is, the small section 500 having no chamfered portion 8 in the solar cell 1 of this embodiment has one bus bar electrode 61 provided on its front side at a position different from the end edge 20 of the semiconductor substrate 2.

To summarize the specific arrangement of the bus bar electrodes 61 on the front side of the solar cell 1 of this embodiment, in the first large section 51, the bus bar electrodes 61 are arranged respectively on the right, right, and right sides, in the direction on FIG. 1A, of the plurality of first small sections 510 sequentially from the inner side of the first large section 51. In the second large section 52, the bus bar electrodes 61 are arranged on the lower, lower, and lower sides respectively of the plurality of second small sections 520 from the inner side of the second large section 52. In the third large section 53, the bus bar electrodes 61 are arranged on the left, left, and left sides respectively of the plurality of third small sections 530 from the inner side of the third large section 53. In the fourth large section 54, the bus bar electrodes 61 are arranged on the upper, upper, and upper sides sequentially from the inner side of the fourth large section 54.

Further, among the small sections 500, each of the small sections 500 with the chamfered portion 8 and the small sections 500 with no chamfered portion 8 has one bus bar electrode 62 provided on the rear side at a position different from the end edge 20 of the semiconductor substrate 2 (see FIG. 1B).

To summarize the specific arrangement of the bus bar electrodes 62 on the back side of the solar cell 1 of this embodiment, in the first large section 51, the bus bar electrodes 62 are arranged respectively on the right, right, and right sides, in the direction on FIG. 1B, of the plurality of first small sections 510 sequentially from the inner side of the first large section 51. In the second large section 52, the bus bar electrodes 62 are arranged on the upper, upper, and upper sides respectively of the plurality of second small sections 520 from the inner side of the second large section 52. In the third large section 53, the bus bar electrodes 62 are arranged on the left, left, and left sides respectively of the plurality of third small sections 530 from the inner side of the third large section 53. In the fourth large section 54, the bus bar electrodes 62 are arranged on the lower, lower, and lower sides sequentially from the inner side of the fourth large section 54.

The solar cell 1 of this embodiment is divided into the small sections 500 to obtain the plurality of small element pieces 7. The small sections 500 are divided along the first large sectioning line 41, the second large sectioning line 42, the first small sectioning lines 55, and the second small sectioning lines 56 to form the plurality of (12 in this embodiment) small element pieces 7 as shown in FIG. 2A and FIG. 2B.

Each of the small element pieces 7 includes the bus bar electrode 61 and the finger electrodes 63 at the respective positions described for each of the small sections 500. Those small sections 500 respectively having the chamfered portions 8 turn to end side small element pieces 71 as shown in FIG. 2A as a result of the division. Those small sections 500 having no chamfered portions 8 turn to a plurality of inner side small element pieces 72 as shown in FIG. 2B as a result of the division. As described above, in this embodiment, the number of kinds of small element pieces 7 is as small as two, which facilitates quality control of the small element pieces 7.

Figure 2A:
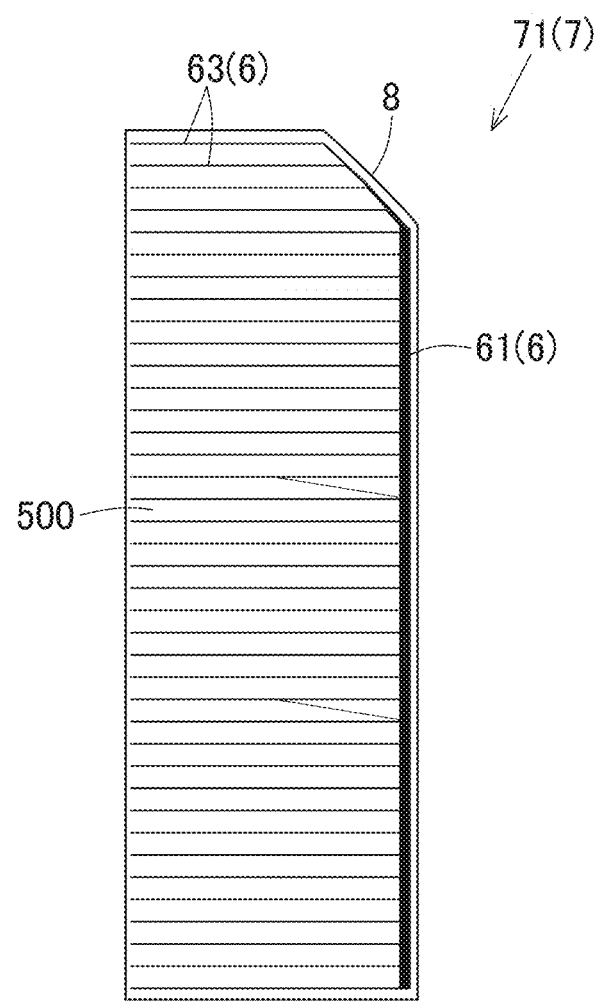
FIG. 2A is a front view of a small element piece having a chamfered portion among small element pieces formed from the solar cell.
Figure 2B:
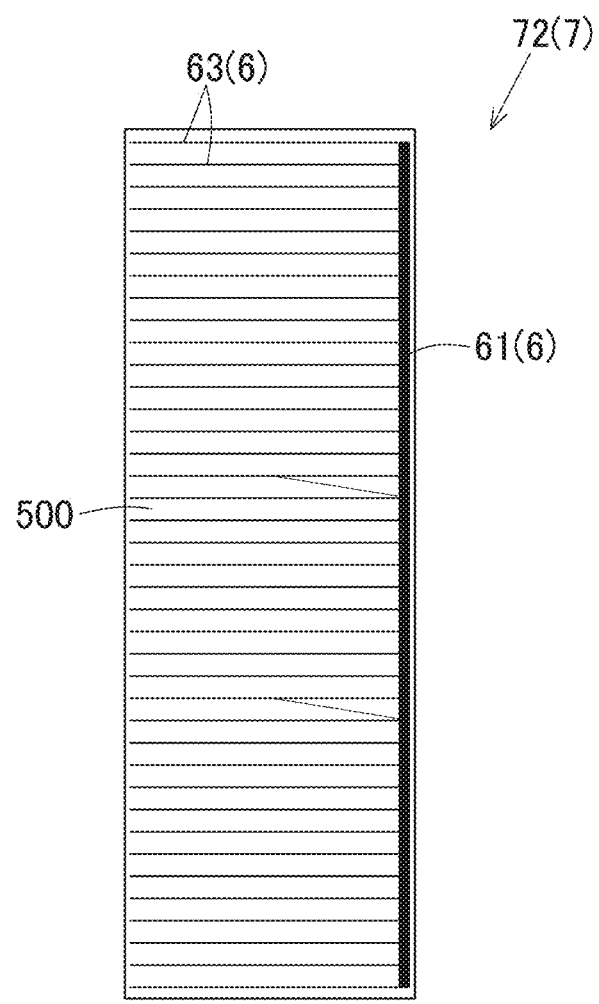
FIG. 2B is a front view of a mall element piece having no chamfered portion among the small element pieces.

The end side small element piece 71 has its front side provided with one bus bar electrode 61 along a long side of the end side small element piece 71 and a side corresponding to the chamfered portion 8 (see FIG. 2A). The inner side small element piece 72 has its front side provided with one bus bar electrode 61 along a long side of the inner side small element piece 72 (see FIG. 2B). As described above, those small element pieces 7 sharing the same shape each have the end edge 20 of the semiconductor substrate 2 located at the same position as that of other ones of those small element pieces 7, that is, each have the outer peripheral portion of the solar cell 1 arranged (located) at the same position as that of other ones of those small element pieces 7. In other words, how the outer peripheral portion of the solar cell 1 is arranged in each of the small element pieces 7 is limited to two patterns. There are some cases where the outer peripheral portion of the solar cell 1 is damaged by, for example, scratches to thereby become a low output part when, for example, being used as a grip during conveying. On the other hand, since how the outer peripheral portion of the solar cell 1 is arranged in each of the small element pieces 7 is limited to two patterns, variations in output can be suppressed within a series-connected body of the small element pieces 7 formed by being interconnected with each other by shingling (so called solar cell string) even when the outer peripheral portion of the solar cell 1 becomes a low output part.

In this embodiment, the plurality of collector electrodes 6 are arranged so as not to extend across the straight lines defining the small sections (i.e., the first large sectioning line 41, the second large sectioning line 42, the first small sectioning lines 55, and the second small sectioning lines 56, which are the lines along which the solar cell 1 is to be divided) (see FIG. 1A and FIG. 1B). In other words, each of the plurality of collector electrodes 6 is arranged to extend within the inner area of each of the small sections 500. That is, the collector electrodes are provided at positions not coinciding with the first small sectioning lines 55 and the second small sectioning lines 56. Specifically, each of the plurality of collector electrodes 6 is arranged preferably 0.05 mm or more inward, more preferably 0.1 mm inward, of an end side of each of the small sections 500. Since the plurality of collector electrodes 6 are arranged away from end edges of the respective divided small element pieces 7, short circuit caused by fragments of the plurality of collector electrodes 6 brought into contact with dividing portions can be prevented when the solar cell 1 is divided into the small element pieces 7.

Figure 3:
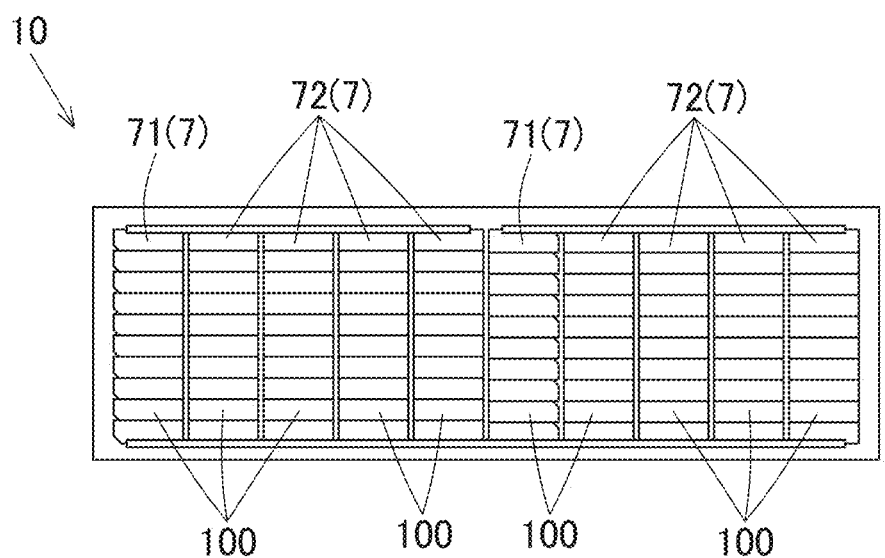
FIG. 3 is a front view showing an example of a solar cell module formed by combining a plurality of the small element pieces.

The plurality of small element pieces 7 thus formed are separated into the end side small element pieces 71 each having the chamfered portion 8 and the inner side small element pieces 72 having no chamfered portion 8, and the end side small element pieces 71 and the inner side small element pieces 72 are separately aligned according to their shapes in plan view to form the solar cell module 10, as shown in, for example, FIG. 3. A unit of an assembly of the plurality of small element pieces 7 forming the solar cell module 10 that are connected in series with each other according to their polarity is referred to as a solar cell string 100. For example, the solar cell module 10 can be formed to have the area of a series of some roof boards (e.g., roof tiles) of a house so as to be arranged on the rooftop in place of the roof boards (e.g., roof tiles).

In this solar cell module 10, only the end side small element pieces 71 each having the chamfered portion 8 are used to form two rows of the solar cell strings 100, and only the inner side small element pieces 72 each having no chamfered portion 8 are used to form eight rows of the solar cell strings 100. The configuration is not limited to this, and can be such that the end side small element pieces 71 each having the chamfered portion 8 and the inner side small element pieces 72 each having no chamfered portion 8 are mixed to form each of the solar cell strings 100. The chamfered portions 8 can face one side or the other side in a direction in which the plurality of small element pieces 7 are aligned.

Figure 4:
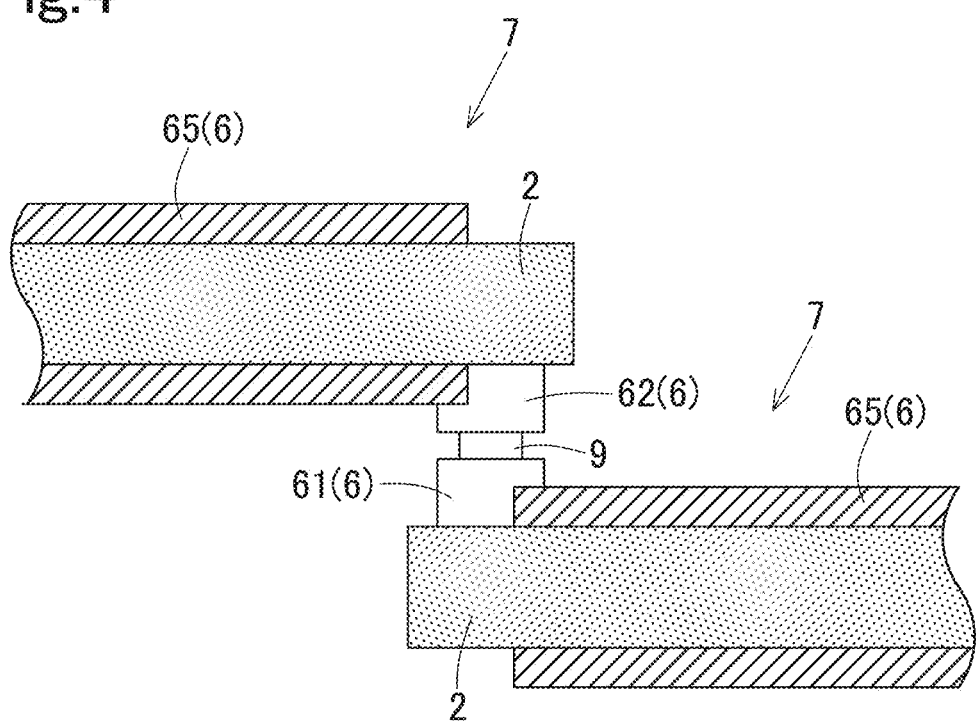
FIG. 4 is an enlarged cross-sectional view showing an essential part of a connected portion of the small element pieces.

To arrange the small element pieces 7 to form a row of each solar cell string 100, as shown in FIG. 4, the bus bar electrode 62 of an upper one of the small element pieces 7 is placed to overlap the bus bar electrode 61 of a lower one of the small element pieces 7, and the bus bar electrodes 61 and 62 overlapping each other are electrically connected to each other via a conductive member 9 (interconnected with each other by shingling). Hatched portions in FIG. 4 show transparent electrode layers 65 formed on the front surface and the rear surface of the semiconductor substrate 2. The plurality of small element pieces 7 thus aligned are connected with each other in series.

According to the solar cell 1 as described above, the semiconductor substrate 2 is sectioned into the four large sections 5 by the first large sectioning line 41 passing the center 30 of the first side 3 of the semiconductor substrate 2 and substantially parallel to the second side 4 of the semiconductor substrate 2, and the second large sectioning line 42 passing the center 40 of the second side 4 and substantially parallel to the first side 3 of the semiconductor substrate 2. With this configuration, one side of each of the four large sections 5 has a dimension that is half the dimension of the first side 3 or the second side 4 of the semiconductor substrate 2. The large sections 5 made by dividing the solar cell 1 each are further divided into the small element pieces 7, and these small element pieces 7 are interconnected with each other by shingling so that the solar cell modules 10 having a greater number of sizes and shapes can be made.

According to the solar cell 1 of this embodiment, the bus bar electrodes 61 each extending in the vertical direction are provided on the front side of each of the first large section 51 and the third large section 53, and the bus bar electrodes 61 each extending in the horizontal direction are provided on the front side of each of the second large section 52 and the fourth large section 54. That is, the bus bar electrodes 61 are provided along the respective sides of the solar cell 1 to be thereby capable of suppressing variations in the shapes of the bus bar electrodes 61 in each of the large sections 5.

According to the solar cell 1 of this embodiment, each of the first large section 51 and the third large section 53 is sectioned into the plurality of small sections 500 by the straight lines extending in the second direction (vertical direction), and each of the second large section 52 and the fourth large section 54 is sectioned into the plurality of small sections 500 by the straight lines extending in the first direction (horizontal direction). With this configuration, the side extending in the first direction (horizontal direction) of each of the small sections 500 obtained from the first large section 51 and the third large section 53 has a dimension equal to or less than a quarter of the dimension of the first side 3 of the semiconductor substrate 2, and the side extending in the second direction (vertical direction) of each of the small sections 500 obtained from the second large section 52 and the fourth large section 54 has a dimension equal to or less than a quarter of the dimension of the second side 4 of the semiconductor substrate 2. Thus, this solar cell 1 is sectioned into the small element pieces 7 corresponding to the respective small sections 500, and these small element pieces 7 are interconnected with each other by shingling so that the solar cell modules 10 having more various sizes and shapes can be made.

It is a matter of course that the solar cell of the present invention is not limited to the aforementioned embodiment, but various modifications can be made without departing from the gist of the present invention. For example, a configuration of an embodiment can be added to a configuration of another embodiment, and part of a configuration of an embodiment can be replaced by a configuration of another embodiment. Further, part of a configuration of an embodiment can be deleted.

Figure 5A:
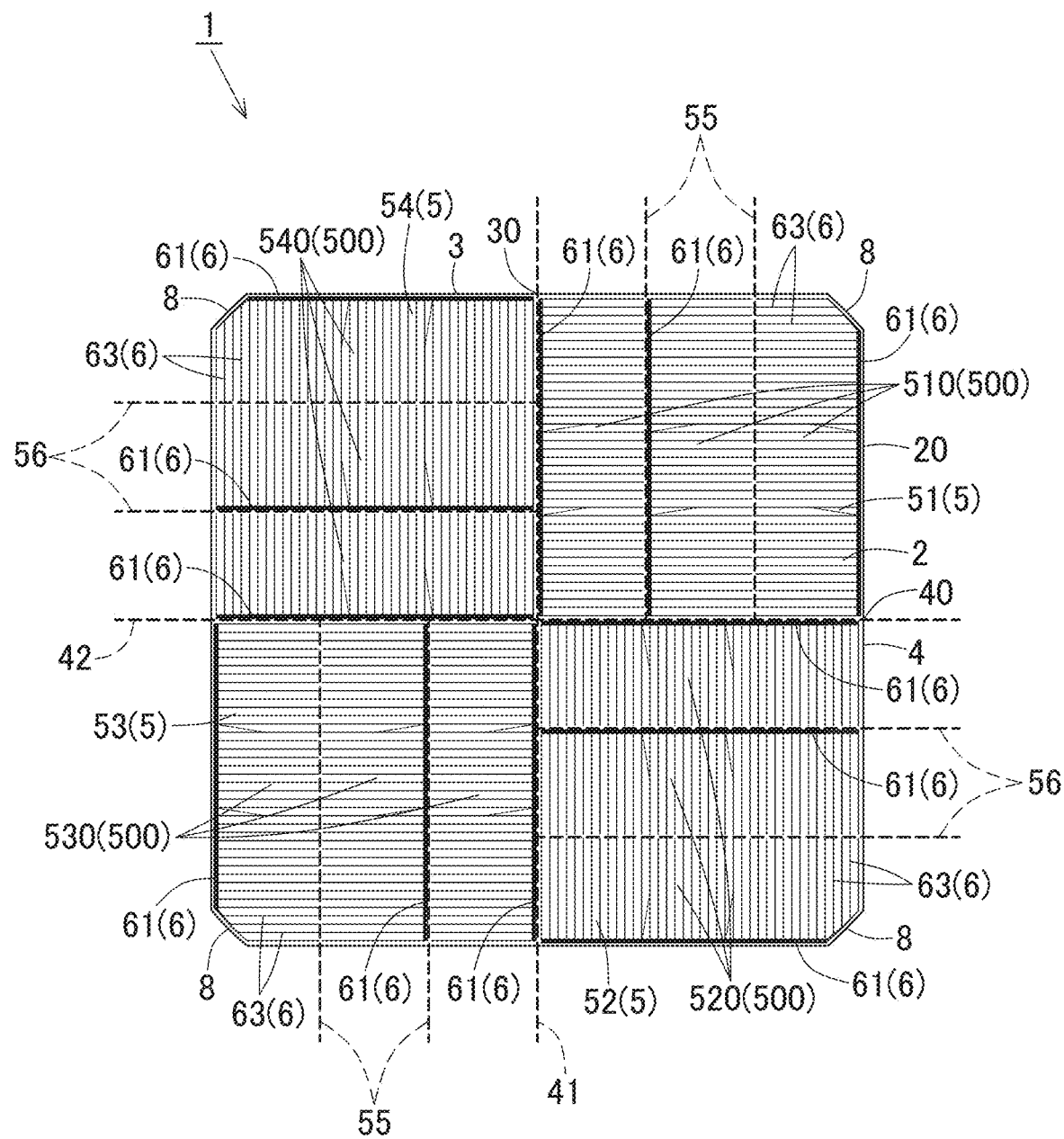
FIG. 5A is a front view of a solar cell according to a modified example.
Figure 5B:
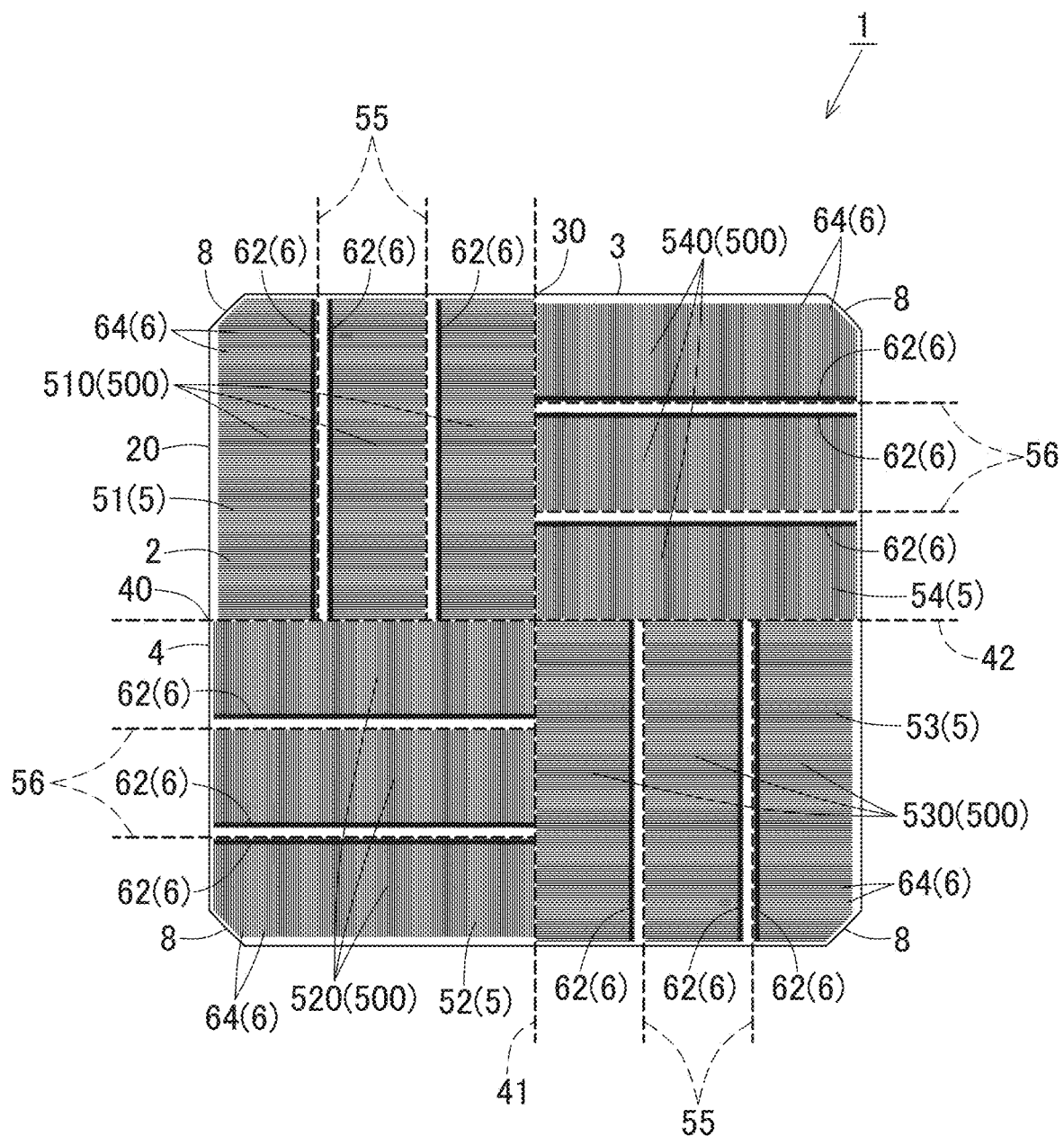
FIG. 5B is a rear view of the solar cell.

The specific arrangement of the bus bar electrodes 61, 62 of the solar cell 1 is not limited to the aforementioned arrangement. For example, it is conceivable that the bus bar electrodes 61, 62 be arranged as shown in FIG. 5A and FIG. 5B. For example, in FIG. 5A, the plurality of first small sections 510 have the bus bar electrodes 61 respectively arranged on the left, left, and right sides sequentially from the inner side of the first large section 51. The plurality of second small sections 520 have the bus bar electrodes 61 respectively arranged on the upper, upper, and lower sides sequentially from the inner side of the second large section 52. The plurality of third small sections 530 have the bus bar electrodes 61 respectively arranged on the right, right, and left sides sequentially from the inner side of the third large section 53. The plurality of fourth small sections 540 have the bus bar electrodes 61 respectively arranged on the lower, lower, and upper sides sequentially from the inner side of the fourth large section 54.

Figure 6A:
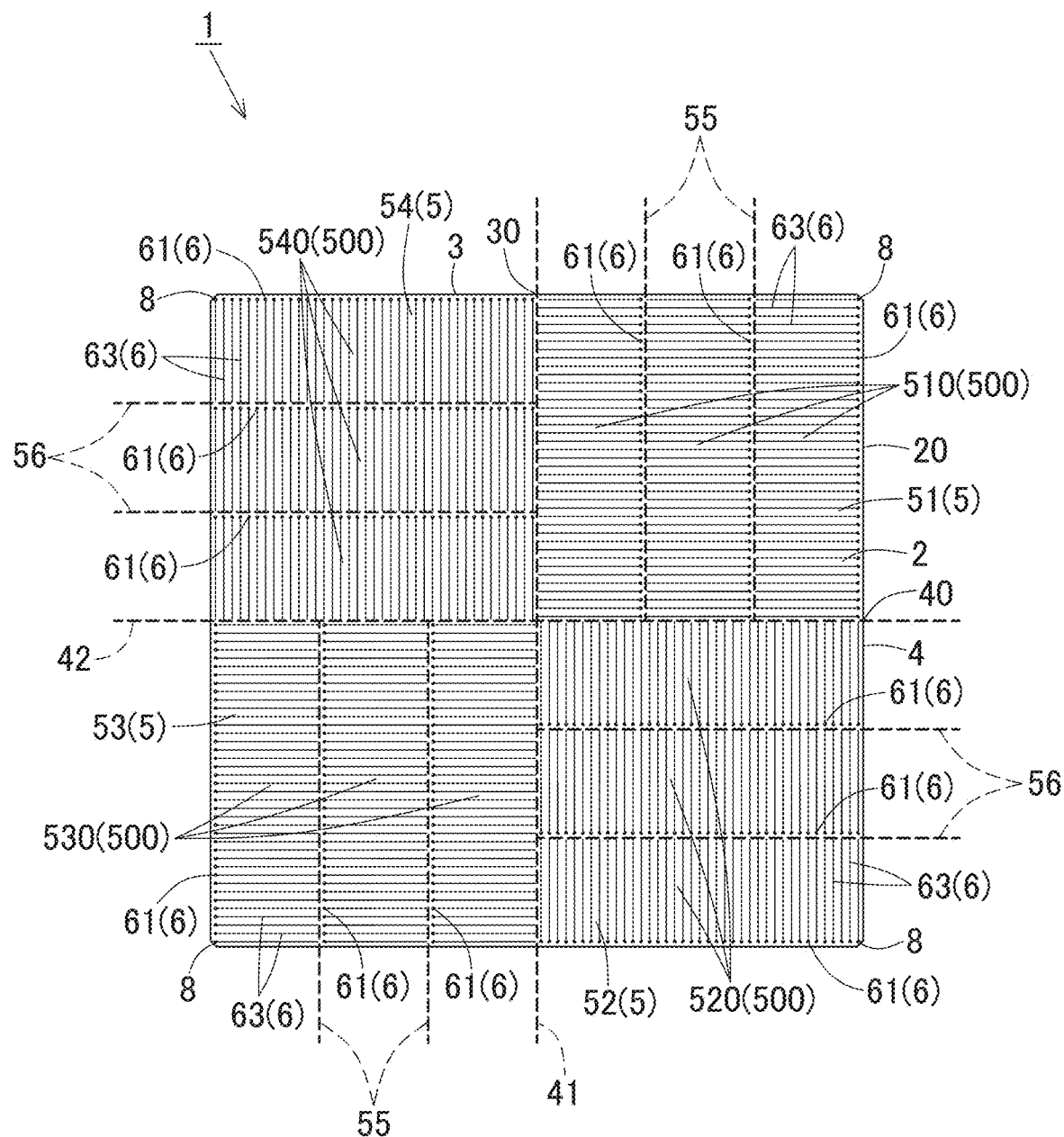
FIG. 6A is a front view of a solar cell according to a modified example.
Figure 6B:
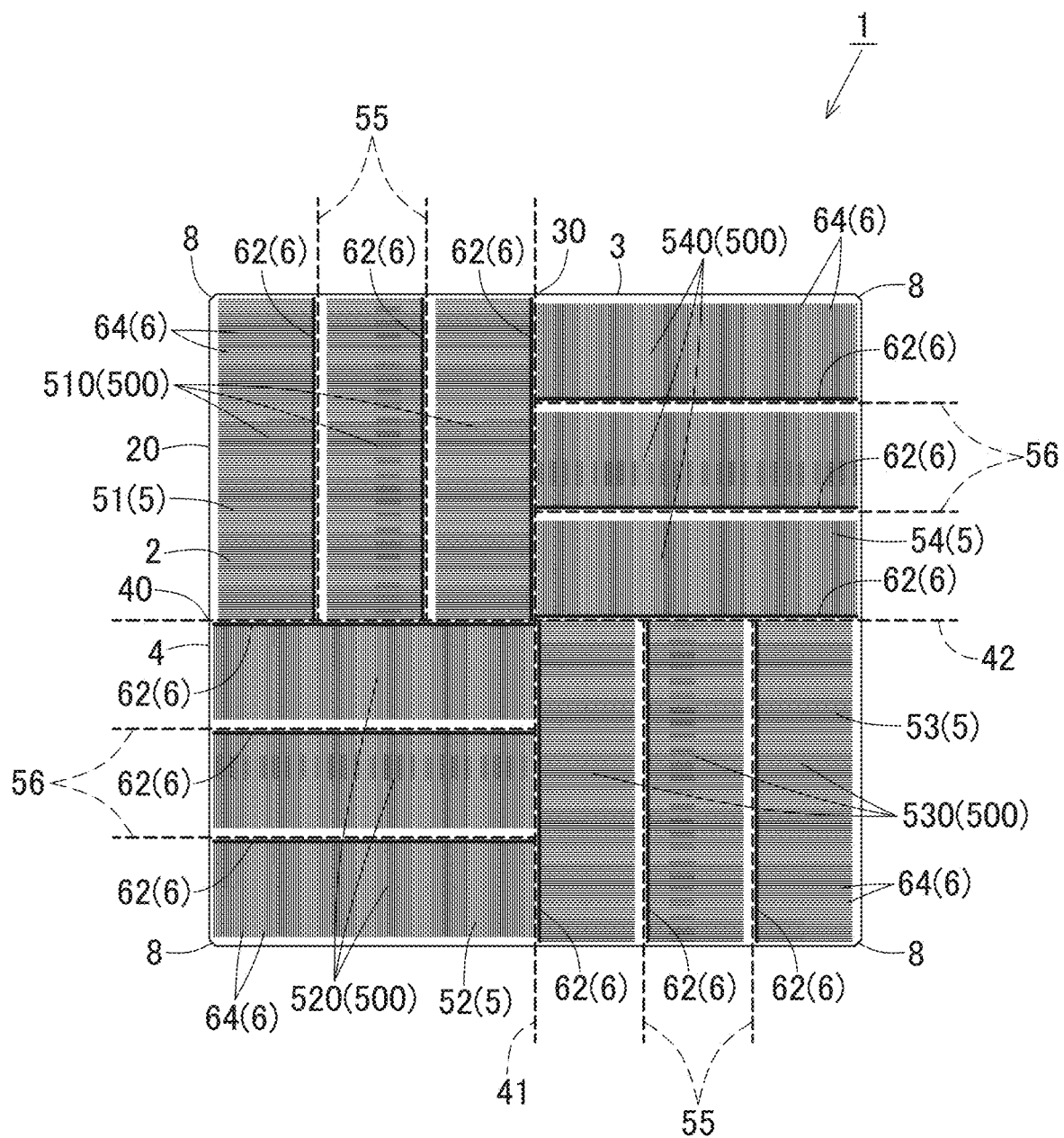
FIG. 6B is a rear view of the solar cell.

The shape of the bus bar electrodes 61, 62 and the shape of the finger electrodes 63, 64 are not limited to the aforementioned shape (linear shape). For example, as shown in FIG. 6A, each of the plurality of bus bar electrodes 61 can be formed of a plurality of dot electrodes that are respectively provided at one ends of the finger electrodes 63 and arranged at intervals from each other. In this case, as shown in FIG. 6B, it is conceivable that each of the bus bar electrodes 62 has a linear shape. This configuration can save the material cost of the bus bar electrodes 61. The configuration can be such that both the bus bar electrodes 61 and 62 are dot electrodes.

Further, each of the bus bar electrodes 61 can be arranged inward of the end edge 20 of the semiconductor substrate 2.

Figure 7A:
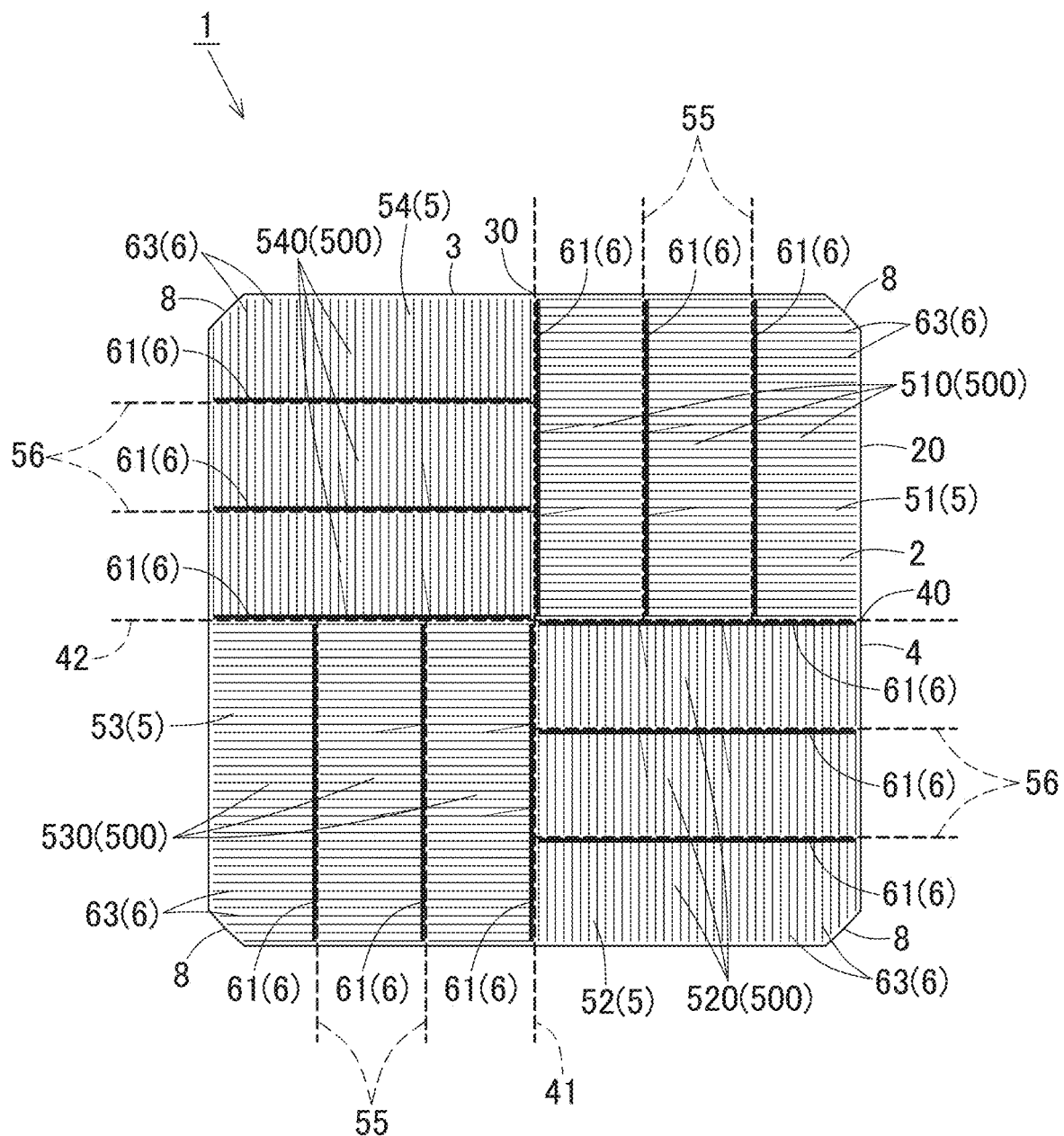
FIG. 7A is a front view of a solar cell according to a modified example.
Figure 7B:
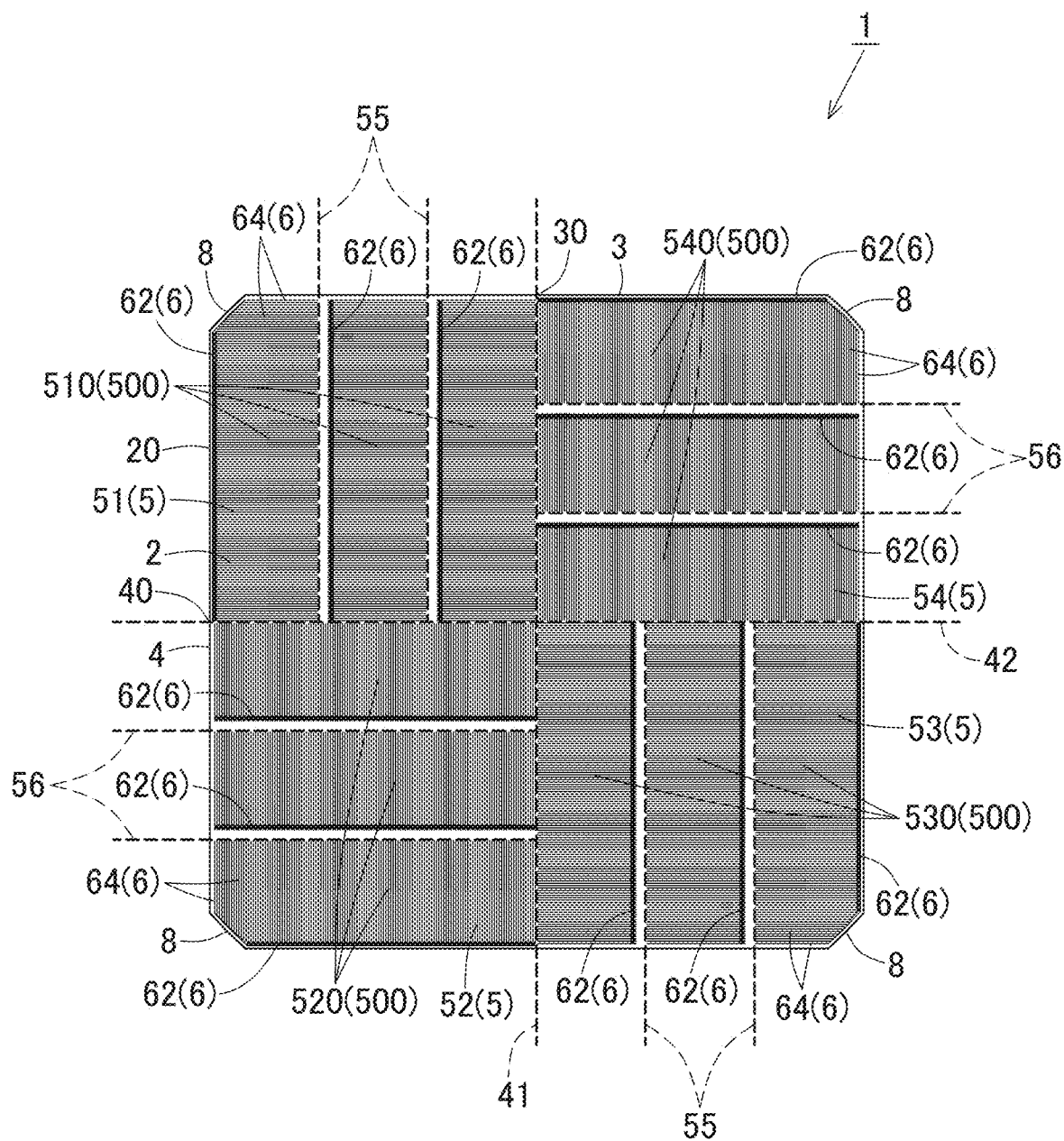
FIG. 7B is a rear view of the solar cell.

For example, as shown in FIG. 7A, the configuration can be such that, among the small sections 500 from which the chamfered portions 8 are excluded, the bus bar electrode 61 provided in each of those small sections 500 having one of a pair of long sides formed by the end edge 20 of the semiconductor substrate 2 is disposed at a position opposite to the end edge 20 of the semiconductor substrate 2. In this case, as shown in FIG. 7B, it is conceivable that the bus bar electrode 62 provided in each of those small sections 500 having one of the pair of long sides formed by the end edge 20 of the semiconductor substrate 2 is disposed along the end edge 20 of the semiconductor substrate 2. This configuration hardly causes damage to the bus bar electrodes 61 provided on the opposite side to the end edge 20 of the semiconductor substrate 2 even if the outer peripheral portion of the solar cell 1 is held at the time of handling the solar cell 1.

Figure 8A:
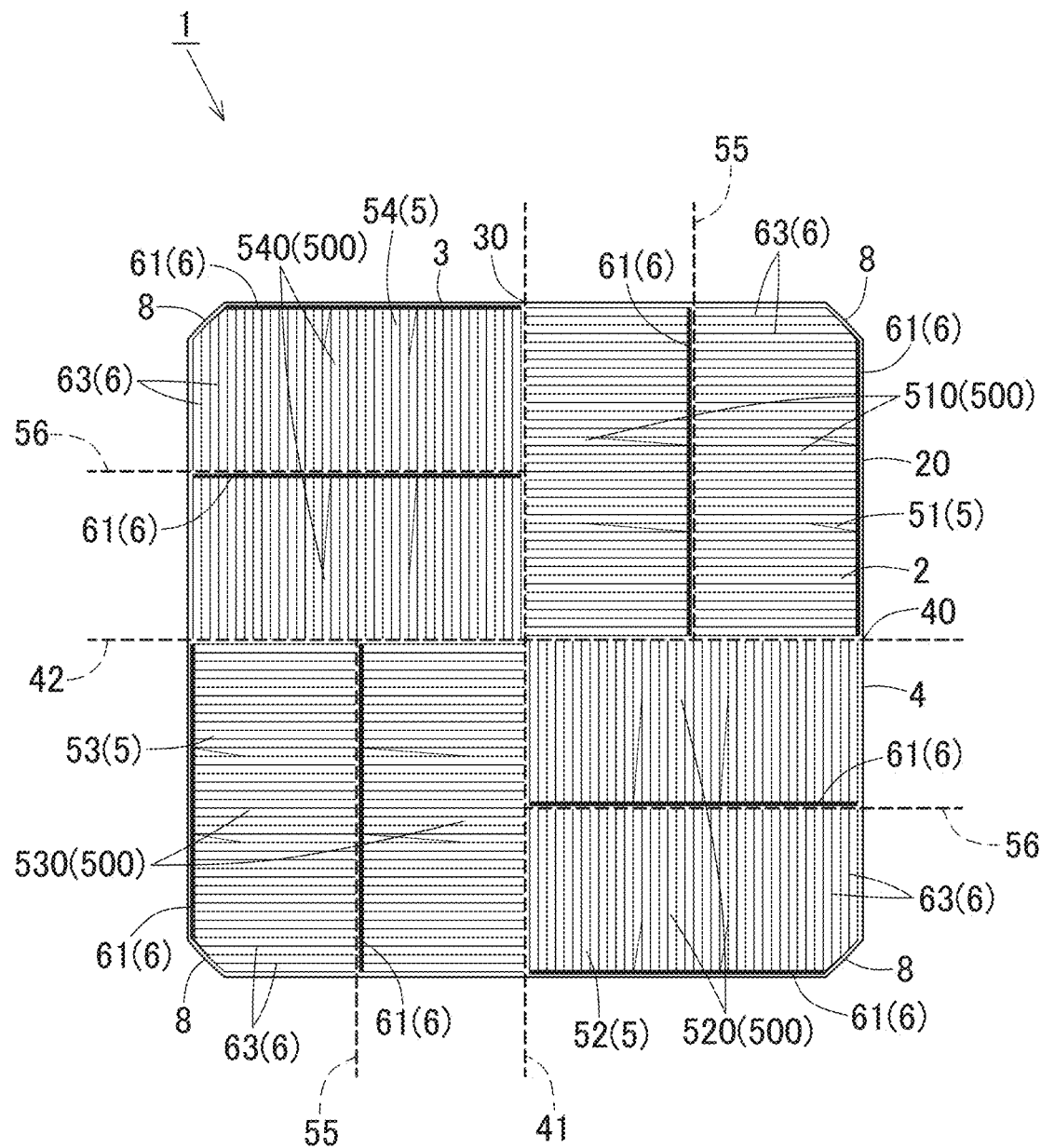
FIG. 8A is a front view of a solar cell according to a modified example.
Figure 8B:
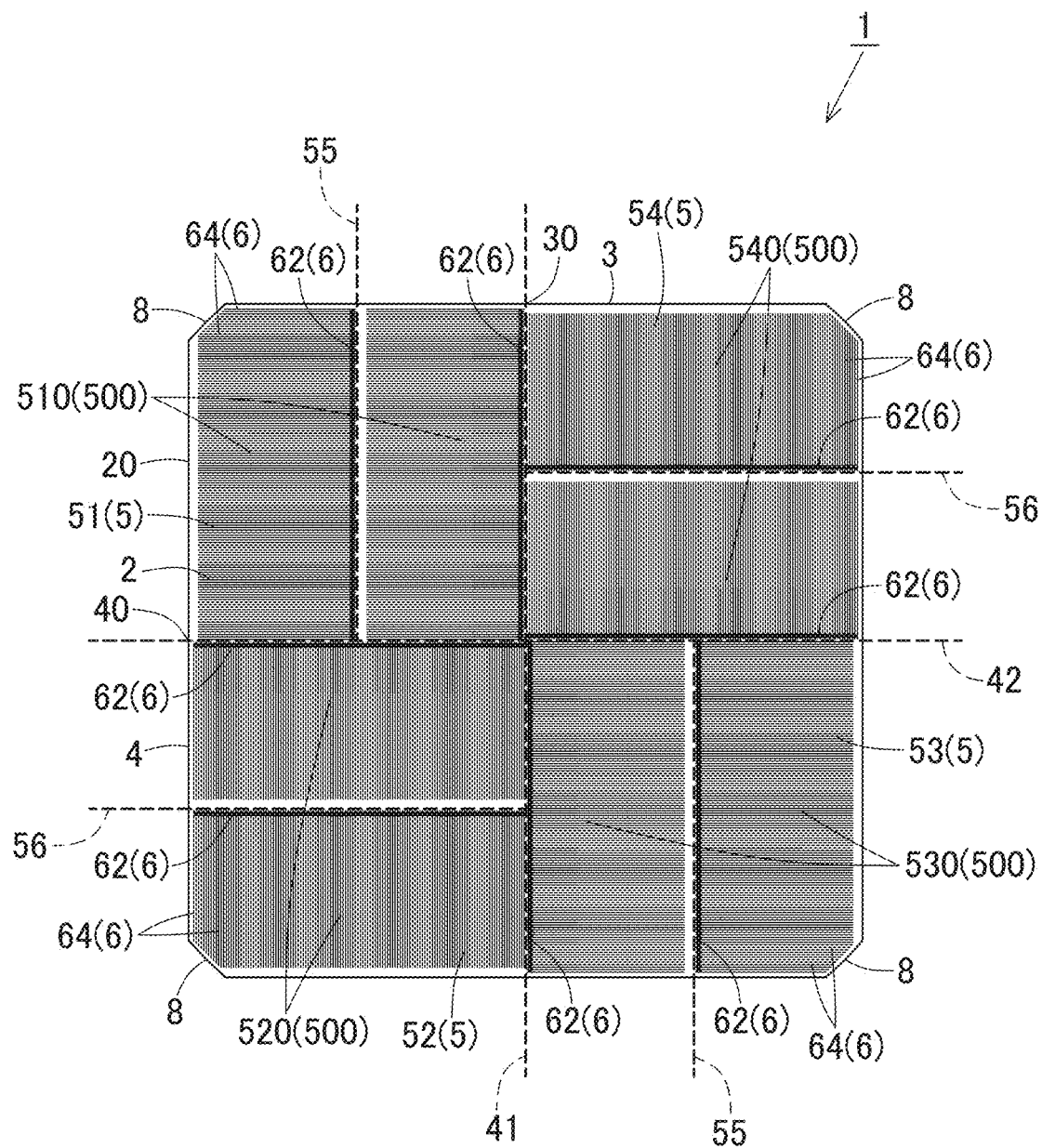
FIG. 8B is a rear view of the cell.

One bus bar electrode 61, or two to four or more bus bar electrodes 61 can be provided on each of the large sections 5. For example, as shown in FIG. 8A and FIG. 8B, the configuration can be such that each of the large sections 5 has two bus bar electrodes 61 and two bus bar electrodes 62.

The configuration can further be such that each of the large sections 5 is sectioned into two to four or more small sections 500. In FIG. 8A and FIG. 8B, each of the large sections 5 is sectioned into two small sections 500.

Figure 9A:
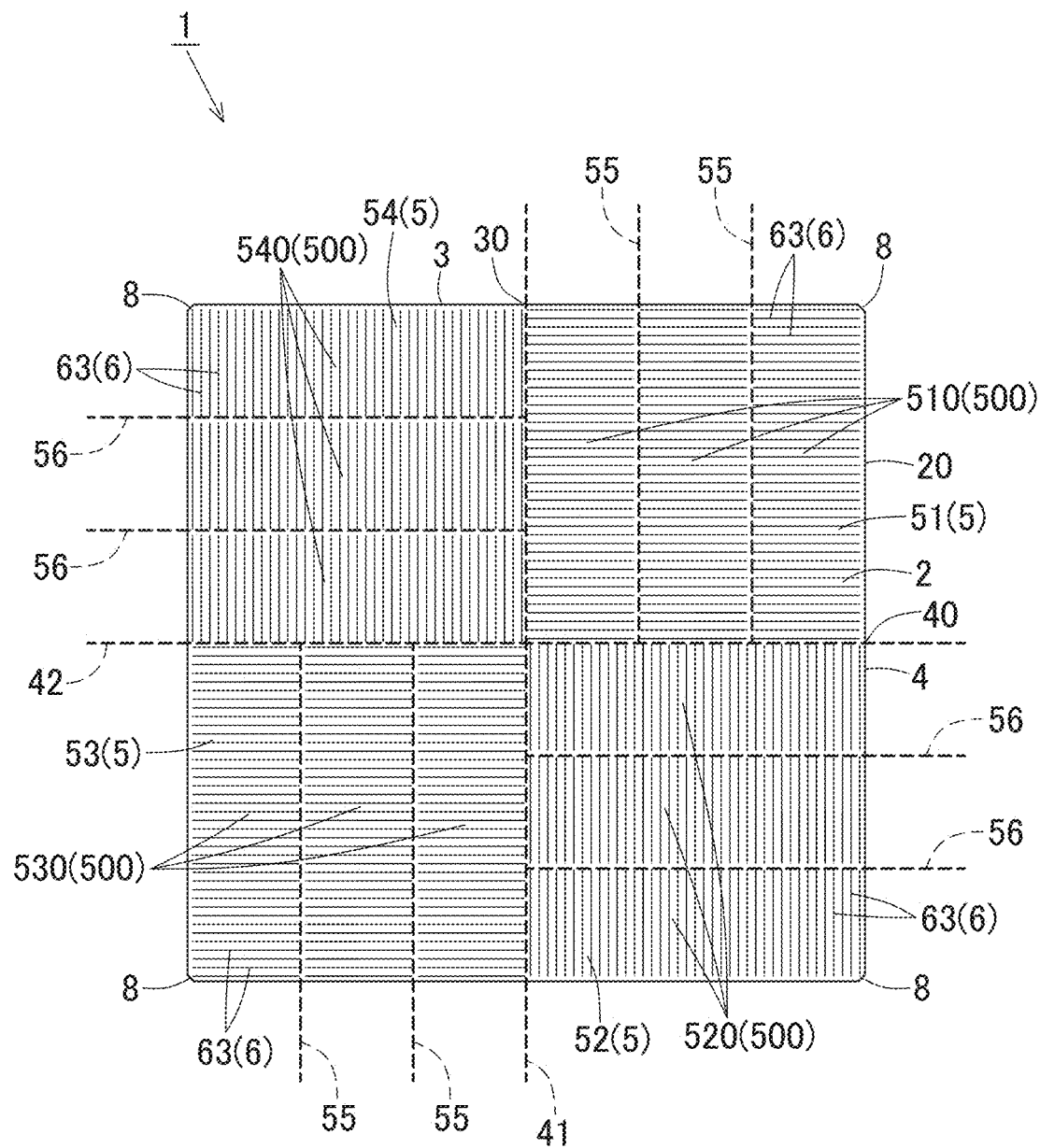
FIG. 9A is a front view of a solar cell according to a modified example.
Figure 9B:
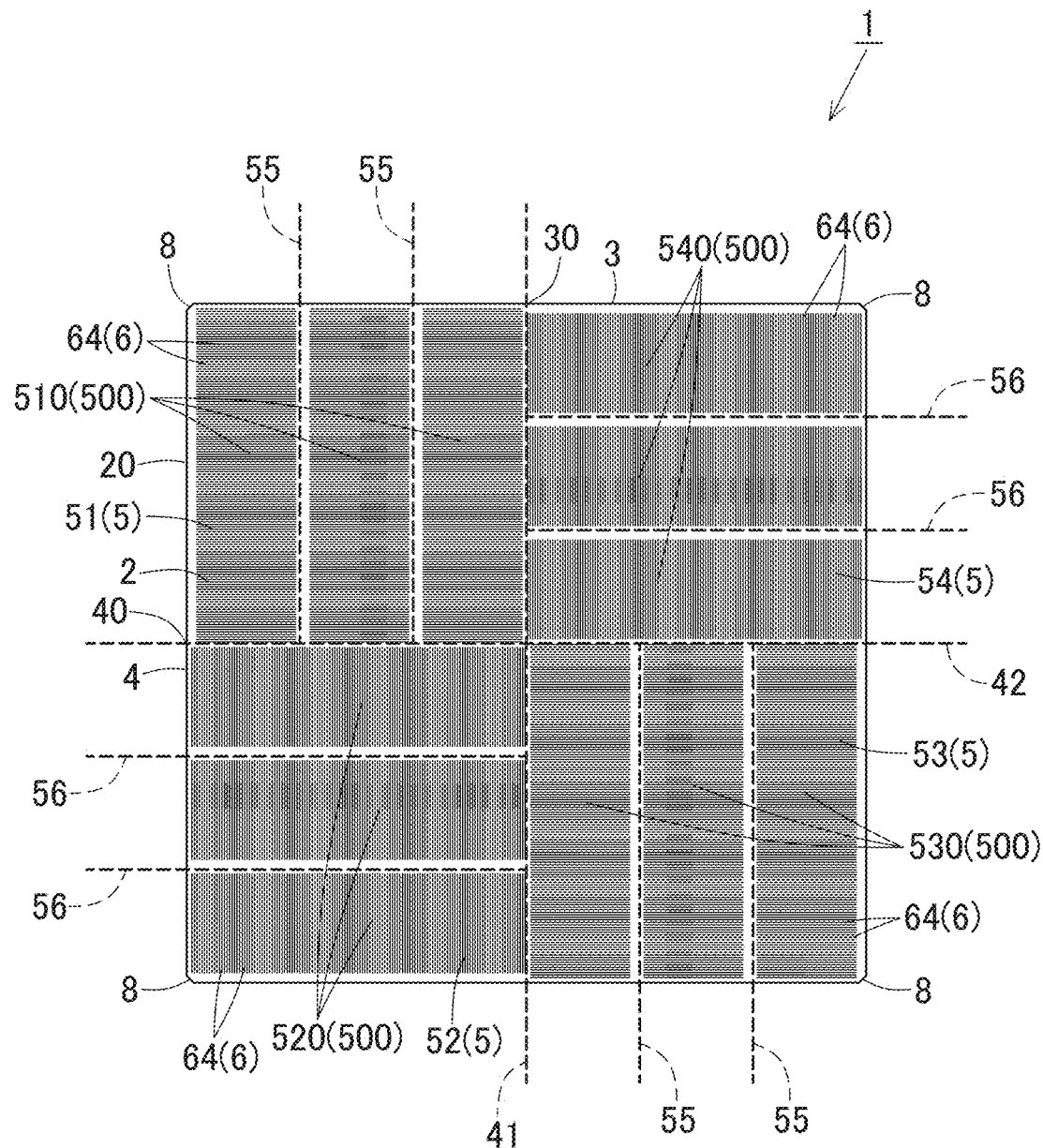
FIG. 9B is a rear view of the solar cell.

As shown in FIG. 9A and FIG. 9B, the configuration can be such that the plurality of collector electrodes 6 include the plurality of finger electrodes 63, 64 only, without the bus bar electrodes 61, 62. This configuration enables the finger electrodes 63, 64 to be conductive with each other without forming the bus bar electrodes 61, 62 on the solar cell 1, and can thus suppress the material cost of the collector electrodes 6. In this case, the finger electrodes 63, 64 are connected with each other via, for example, the conductive member 9.

Each of the large sections 5 in this embodiment is sectioned into the plurality of small sections 500, but the configuration can be such that each of the large sections 5 is not sectioned into a plurality of small sections 500. Even in this case, the large sections 5 formed by sectioning the solar cell 1 serve as the small element pieces 7, and these small element pieces 7 are interconnected with each other by shingling so that the solar cell modules 10 having various sizes and shapes can be made.

As described above, according to the present invention, provided can be a solar cell for forming small element pieces to be interconnected with each other by shingling, the solar cell capable of being used for solar cell modules of various sizes and shapes.

A solar cell of the present invention is a solar cell having a substantially rectangular shape, the solar cell including: a semiconductor substrate having a substantially rectangular shape; and a plurality of collector electrodes formed on the semiconductor substrate, in which the semiconductor substrate is sectioned into four large sections by a first large sectioning line that is a straight line passing a center of a first side of the semiconductor substrate and substantially parallel to a second side continuous with the first side of the semiconductor substrate, and by a second large sectioning line that is a straight line passing through a center of the second side of the semiconductor substrate and substantially parallel to the first side of the semiconductor substrate, the four large sections include a first large section, a second large section, a third large section, and a fourth large section, which are aligned next to each other in a clockwise order, the plurality of collector electrodes include a plurality of finger electrodes, in which each of the first large section, the second large section, the third large section, and the fourth large section is provided on a front side with at least one of the plurality of finger electrodes, the at least one of the plurality of finger electrodes provided on each of the first large section and the third large section extends in a first direction substantially parallel to the first side of the semiconductor substrate, and the at least one of the plurality of finger electrodes provided on each of the second large section and the fourth large section extends in a second direction substantially parallel to the second side of the semiconductor substrate.

According to such a configuration, one side of each of the large sections has a dimension that is half the dimension of the first side or the second side of the semiconductor substrate; thus, the solar cell is divided at least into the large sections to form the small element pieces, and these small element pieces are interconnected with each other by shingling so that the solar cell modules having various sizes and shapes can be made.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, the at least one of the plurality of bus bar electrodes provided on each of the first large section and the third large section extends in the second direction, and the at least one of the plurality of bus bar electrodes provided on each of the second large section and the fourth large section extends in the first direction.

According to such a configuration, the bus bar electrodes are provided along the respective sides of the solar cell to be thereby capable of suppressing variations in the shapes of the bus bar electrodes in each of the large sections.

The solar cell can be configured such that each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of small sections has at least one of the plurality of bus bar electrodes provided on the front side.

According to such a configuration, the side extending in the first direction of each of the small sections obtained from the first large section and the third large section has a dimension equal to or less than a quarter of the dimension of the first side of the semiconductor substrate, and the side extending in the second direction of each of the small sections obtained from the second large section and the fourth large section has a dimension equal to or less than a quarter of the dimension of the second side of the semiconductor substrate. Thus, this solar cell is divided into the small element pieces corresponding to the respective small sections, and these small element pieces are interconnected with each other by shingling so that the solar cell modules having more various sizes and shapes can be made.

The solar cell can be configured such that each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of collector electrodes is provided at a position not coinciding with the first small sectioning line and the second small sectioning line.

Such a configuration can prevent a short circuit between the front side and the rear side of the semiconductor substrate when, for example, the collector electrodes are divided at the time of dividing the solar cell into the small sections.

The solar cell can be configured such that each of the plurality of small sections has a substantially rectangular shape, and a bus bar electrode provided in each of the plurality of small sections having one of a pair of long sides formed by an end edge of the semiconductor substrate is disposed at a position opposite to the end edge of the semiconductor substrate.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, each of the plurality of collector electrodes is provided at a position not coinciding with the first small sectioning line and the second small sectioning line, each of the plurality of small sections has a substantially rectangular shape, and the at least one of the plurality of bus bar electrodes provided in each of the plurality of small sections having one of a pair of long sides formed by an end edge of the semiconductor substrate is disposed at a position opposite to the end edge of the semiconductor substrate.

Such a configuration hardly causes damage to the bus bar electrodes provided on the opposite side to the end edge of the semiconductor substrate even if the outer peripheral portion is held at the time of handling the solar cell.

The solar cell can be configured such that each of the plurality of bus bar electrodes is formed of a plurality of dot electrodes that are respectively provided at one ends of the plurality of finger electrodes and arranged at intervals from each other.

The solar cell can be configured such that the plurality of collector electrodes include a plurality of bus bar electrodes, in which each of the first large section, the second large section, the third large section, and the fourth large section is provided on the front side with at least one of the plurality of bus bar electrodes, and each of the plurality of bus bar electrodes is formed of a plurality of dot electrodes that are respectively provided at one ends of the plurality of finger electrodes and arranged at intervals from each other.

Such a configuration can save the material cost of the bus bar electrodes.

The solar cell can be configured such that the plurality of collector electrodes include the plurality of finger electrodes only, and include no bus bar electrode.

Such a configuration enables the finger electrodes to be conductive with each other without forming the bus bar electrodes on the solar cell, and can thus suppress the material cost of the collector electrodes.

REFERENCE SIGNS LIST

1: Solar cell
2: Semiconductor substrate
3: First side
4: Second side
5: Large section
6: Collector electrode
7: Small element piece
8: Chamfered portion
9: Conductive member
10: Solar cell module
20: End edge
30: Center
40: Center
41: First large sectioning line
42: Second large sectioning line
51: First large section
52: Second large section
53: Third large section
54: Fourth large section
55: First small sectioning line
56: Second small sectioning line
61, 62: Bus bar electrode
63, 64: Finger electrode
65: Transparent electrode layer
71: End side small element piece
72: Inner side small element piece
100: Solar cell string
500: Small section
510: First small section
520: Second small section
530: Third small section
540: Fourth small section

The invention claimed is:

1. A solar cell having a substantially rectangular shape, the solar cell comprising: a semiconductor substrate having a substantially rectangular shape; and a plurality of collector electrodes formed on the semiconductor substrate, wherein the semiconductor substrate is sectioned into four large sections by a first large sectioning line that is a straight line passing through a center of a first side of the semiconductor substrate and substantially parallel to a second side continuous with the first side of the semiconductor substrate, and by a second large sectioning line that is a straight line passing through a center of the second side of the semiconductor substrate and substantially parallel to the first side of the semiconductor substrate, the four large sections comprise a first large section, a second large section, a third large section, and a fourth large section, which are aligned next to each other in a clockwise order, the plurality of collector electrodes comprise a plurality of finger electrodes, wherein each of the first large section, the second large section, the third large section, and the fourth large section is provided on a front side with at least one of the plurality of finger electrodes, an entirety of a length of each of the at least one of the plurality of finger electrodes provided on each of the first large section and the third large section extends in a first direction substantially parallel to the first side of the semiconductor substrate, and an entirety of a length of each of the at least one of the plurality of finger electrodes provided on each of the second large section and the fourth large section extends in a second direction substantially parallel to the second side of the semiconductor substrate.

2. The solar cell according to claim 1, wherein the plurality of collector electrodes comprise a plurality of bus bar electrodes, wherein each of the first large section, the second large section, the third large section, and the fourth large section is provided on the front side with at least one of the plurality of bus bar electrodes, the at least one of the plurality of bus bar electrodes provided on each of the first large section and the third large section extends in the second direction, and the at least one of the plurality of bus bar electrodes provided on each of the second large section and the fourth large section extends in the first direction.

3. The solar cell according to claim 2, wherein each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of small sections has at least one of the plurality of bus bar electrodes provided on the front side.

4. The solar cell according to claim 3, wherein each of the plurality of small sections has a substantially rectangular shape, and a bus bar electrode provided in each of the plurality of small sections having one of a pair of long sides formed by an end edge of the semiconductor substrate is disposed at a position opposite to the end edge of the semiconductor substrate.

5. The solar cell according to claim 2, wherein each of the plurality of bus bar electrodes is formed of a plurality of dot electrodes that are respectively provided at one ends of the plurality of finger electrodes and arranged at intervals from each other.

6. The solar cell according to claim 1, wherein each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, and each of the plurality of collector electrodes is provided at a position not coinciding with the first small sectioning line and the second small sectioning line.

7. The solar cell according to claim 1, wherein the plurality of collector electrodes comprise a plurality of bus bar electrodes, wherein each of the first large section, the second large section, the third large section, and the fourth large section is provided on the front side with at least one of the plurality of bus bar electrodes, each of the first large section and the third large section is sectioned into a plurality of small sections by a first small sectioning line that is at least one straight line extending in the second direction, each of the second large section and the fourth large section is sectioned into the plurality of small sections by a second small sectioning line that is at least one straight line extending in the first direction, each of the plurality of collector electrodes is provided at a position not coinciding with the first small sectioning line and the second small sectioning line, each of the plurality of small sections has a substantially rectangular shape, and the at least one of the plurality of bus bar electrodes provided in each of the plurality of small sections having one of a pair of long sides formed by an end edge of the semiconductor substrate is disposed at a position opposite to the end edge of the semiconductor substrate.

8. The solar cell according to claim 1, wherein the plurality of collector electrodes comprise a plurality of bus bar electrodes, wherein each of the first large section, the second large section, the third large section, and the fourth large section is provided on the front side with at least one of the plurality of bus bar electrodes, and each of the plurality of bus bar electrodes is formed of a plurality of dot electrodes that are respectively provided at one ends of the plurality of finger electrodes and arranged at intervals from each other.

9. The solar cell according to claim 1, wherein the plurality of collector electrodes comprise the plurality of finger electrodes only, and comprise no bus bar electrode.

* * * * *